(12) United States Patent
Ohno et al.

(10) Patent No.: US 9,135,973 B2
(45) Date of Patent: Sep. 15, 2015

(54) MAGNETORESISTANCE EFFECT ELEMENT AND MAGNETIC MEMORY

(75) Inventors: Hideo Ohno, Sendai (JP); Shoji Ikeda, Sendai (JP); Fumihiro Matsukura, Sendai (JP); Masaki Endoh, Sendai (JP); Shun Kanai, Sendai (JP); Katsuya Miura, Higashimurayama (JP); Hiroyuki Yamamoto, Shiki (JP)

(73) Assignee: TOHOKU UNIVERSITY, Miyagi (JP)

( * ) Notice: Subject to any disclaimer, the term of this patent is extended or adjusted under 35 U.S.C. 154(b) by 346 days.

(21) Appl. No.: 13/701,257

(22) PCT Filed: May 26, 2011

(86) PCT No.: PCT/JP2011/062119
§ 371 (c)(1),
(2), (4) Date: Feb. 21, 2013

(87) PCT Pub. No.: WO2011/152281
PCT Pub. Date: Dec. 8, 2011

(65) Prior Publication Data
US 2013/0141966 A1  Jun. 6, 2013

(30) Foreign Application Priority Data
Jun. 3, 2010  (JP) ................................. 2010-128051

(51) Int. Cl.
*G11C 11/16* (2006.01)
*H01L 43/08* (2006.01)
(Continued)

(52) U.S. Cl.
CPC ................ *G11C 11/16* (2013.01); *G11C 11/14* (2013.01); *G11C 11/161* (2013.01); *H01L 43/02* (2013.01); *H01L 43/08* (2013.01); *H01L 27/228* (2013.01)

(58) Field of Classification Search
CPC ........ H01L 43/02; H01L 43/08; H01L 43/085; G11C 11/14–11/16; G11C 11/161
See application file for complete search history.

(56) References Cited

U.S. PATENT DOCUMENTS 8,299,552 B2 * 10/2012 Nagase et al. ................ 257/421
8,379,429 B2 *  2/2013 Ishiwata et al. ................ 365/80
(Continued)

FOREIGN PATENT DOCUMENTS

JP  2008-109118  5/2008
JP  2009-99625   5/2009
(Continued)

OTHER PUBLICATIONS

Office Action in corresponding Japan Application No. 2012-518356, dated Oct. 1, 2013, with English translation thereof.
(Continued)

*Primary Examiner* — Allison P Bernstein
(74) *Attorney, Agent, or Firm* — Baker Botts L.L.P.

(57) ABSTRACT

Provided are a magnetoresistance effect element with a stable magnetization direction perpendicular to film plane and a controlled magnetoresistance ratio, in which writing can be performed by magnetic domain wall motion, and a magnetic memory including the magnetoresistance effect element. The magnetoresistance ratio is controlled by forming a ferromagnetic layer of the magnetoresistance effect element from a ferromagnetic material including at least one type of 3d transition metal or a Heusler alloy. The magnetization direction is changed from a direction in the film plane to a direction perpendicular to the film plane by controlling the film thickness of the ferromagnetic layer on an atomic layer level.

19 Claims, 11 Drawing Sheets

(51) Int. Cl.
*H01L 43/02* (2006.01)
*G11C 11/14* (2006.01)
*H01L 27/22* (2006.01)

(56) References Cited

U.S. PATENT DOCUMENTS

| | | | |
|---|---|---|---|
| 8,514,619 B2* | 8/2013 | Hwang | 365/173 |
| 8,541,855 B2* | 9/2013 | Jan et al. | 257/421 |
| 2008/0231998 A1 | 9/2008 | Yoshikawa et al. | |
| 2010/0188890 A1 | 7/2010 | Fukami et al. | |
| 2010/0193889 A1 | 8/2010 | Nagahara et al. | |
| 2011/0049659 A1 | 3/2011 | Suzuki et al. | |
| 2013/0234268 A1* | 9/2013 | Kariyada et al. | 257/421 |

FOREIGN PATENT DOCUMENTS

| | | |
|---|---|---|
| WO | WO 2009/001706 A1 | 12/2008 |
| WO | WO 2009/019949 A1 | 2/2009 |
| WO | WO 2009/133650 | 11/2009 |

OTHER PUBLICATIONS

Office Action in corresponding Japanese Appln. No. 2012-518356, issued on Dec. 17, 2013, and English translation thereof.

M. Endo et al., Electric-field effects on thickness dependent magnetic anisotropy of sputtered MgO/Co40Fe40B20/Ta structures, Applied Physics Letters96, 212503 (2010).

S. Ikeda et al., Tunnel magnetoresistance of 604% at 300 K by suppression of Ta diffusion in CoFeB/MgO/CoFeB pseudo-spin-valves annealed at high temperature, Applied Physics Letter 93, 082508 (2008).

J.C. Slonczewski, Current-driven excitation of magnetic multilayers, Journal of Magnetism and Magnetic Materials 159 (1996) L1-L7.

Mikihiko Oogane et al., Magnetic Damping in Ferromagnetic Thin Films, Japanese Journal of Applied Physics, 2006, pp. 3889-389, vol. 45, No. 5A.

S. Mangin et al., current-induced magnetization reversal in nanopillars with perpendicular anisotropy, Nature Materials, Mar. 2006, pp. 210-215, vol. 5.

* cited by examiner (a)

(b)

(a)

(b)

MAGNETORESISTANCE EFFECT ELEMENT AND MAGNETIC MEMORY

TECHNICAL FIELD

The present invention relates to a magnetoresistance effect element and a magnetic memory (MRAM: Magnetic Random Access Memory) provided with the magnetoresistance effect element as a memory cell. Particularly, the present invention relates to a MRAM in which a magnetic domain wall motion system is adopted for write operation.

BACKGROUND

A MRAM is a nonvolatile memory that is considered a promising candidate for a universal memory from the viewpoint of high integration and high operating speed, for example. In a memory cell of a MRAM, a magnetoresistance effect element, such as a GMR (giant magnetoresistance) element or a TMR (tunnel magnetoresistance) element, is used as a storage element. These elements have a three-layer structure as a basic structure such that a non-magnetic layer is sandwiched between two ferromagnetic layers, i.e., a first ferromagnetic layer and a second ferromagnetic layer. One of the two ferromagnetic layers is a pinned layer with a fixed direction of magnetization, while the other is a recording layer with a switchable direction of magnetization. In the following, an example is described in which the first ferromagnetic layer is the pinned layer and the second ferromagnetic layer is the recording layer. The element has a low resistance when the magnetization direction of the pinned layer and the magnetization direction of the recording layer are parallel to each other (P state), or a high resistance when the magnetization directions are antiparallel (AP state). The ratio of such changes in resistance exceeds 600% at room temperature in the case of a TMR element in which MgO is used for the non-magnetic layer, as described in Non-patent Document 1, for example. The resistance ratio is known to be particularly high in the case involving coherent tunneling conduction via the $\Delta_1$ band, which is realized in a combination of a ferromagnetic material that contains at least one 3d transition metal element, such as Co or Fe, and MgO. In the MRAM, the resistance change is associated with bit information of "0" and "1". As a method for writing bit information, a magnetization switching system based on spin injection has been proposed, as described in Non-patent Document 2. This system utilizes the phenomenon in which magnetization direction is changed by spin-transfer torque produced by a current caused to flow through the magnetoresistance effect element. When the current is caused to flow from the pinned layer to the recording layer, the magnetizations of the pinned layer and the recording layer become antiparallel, and the bit information is "1". On the other hand, when current is caused to flow from the recording layer to the pinned layer, the magnetizations of the pinned layer and the recording layer are parallel, and the bit information is "0".

However, in this system, a large current needs to flow through the magnetoresistance effect element itself at the time of writing. Thus, in the case of the TMR element with an insulator for the non-magnetic layer, the withstand voltage of an insulating layer becomes an issue. Further, as the reading speed is increased, higher magnetoresistance ratio values are required; generally, a high magnetoresistance ratio of 70% to 100% or higher is required. In the case of a GMR element in which an insulating layer is not used in the non-magnetic layer, there is the problem of long read time because of the small resistance ratio.

Patent Document 1, for example, discloses a MRAM of the magnetic domain wall motion type in which magnetic domain wall motion by a spin transfer effect is utilized. A magnetic domain wall is a region with a finite volume at the boundary of a plurality of regions called "magnetic domains" in which magnetization directions are aligned in a ferromagnet. Particularly, when the magnetization directions of two magnetic domains adjacent to each other are antiparallel, the magnetic domain wall at their boundary is referred to as a 180° magnetic domain wall. The magnetoresistance effect element of a memory cell of the magnetic domain wall motion type MRAM described in Patent Document 1 is provided with a pinned layer with fixed magnetization; a non-magnetic layer stacked on the pinned layer; and a magnetic recording layer stacked on the non-magnetic layer.

FIG. 1 shows a basic structure of a magnetoresistance effect element 100 of a memory cell of the magnetic domain wall motion type MRAM described in Patent Document 1, for example. FIG. 1(a) is a plan view, and FIG. 1(b) is a cross-sectional view. The magnetoresistance effect element 100 is provided with a pinned layer 101 which is a ferromagnet with fixed magnetization; a non-magnetic layer 102 stacked on the pinned layer; and a ferromagnetic magnetic recording layer 103 stacked on the non-magnetic layer. The magnetic recording layer 103 has a thin wire shape. Specifically, the magnetic recording layer 103 includes a magnetization switching region 104 with a region in which a magnetic domain wall with a finite width can move, the region disposed at a portion overlapping with the pinned layer 101 and the non-magnetic layer 102; and a pair of pinned magnetization regions 105 and 106 formed adjacent to the magnetization switching region 104. The pinned magnetization regions 105 and 106 are provided with pinned magnetization of opposite directions.

To the pinned magnetization regions 105 and 106, current supply terminals 107 and 108, respectively, are joined. To the pinned layer 101, a current supply terminal 107 is joined. At the time of writing, a write current is passed, via the current supply terminals 107 and 108, through the magnetization switching region 104 and the pinned magnetization regions 105 and 106 of the magnetic recording layer 103. In the magnetization switching region 104, a magnetic domain wall 110 is introduced. The magnetization switching region 104 have magnetization directions antiparallel to each other, with the magnetic domain wall 110 providing a boundary. When the write current flows, the magnetic domain wall 110 is moved such that the magnetization direction is changed in a region of the magnetization switching region 104 immediately above the pinned layer 101 and the non-magnetic layer 102. In the example of FIG. 1, when the current is passed from the current supply terminal 107 to the current supply terminal 108, the magnetic domain wall 110 is moved toward the pinned magnetization layer 105 such that the magnetization direction of the region of the magnetization switching region 104 immediately above the pinned layer 101 and the non-magnetic layer 102 becomes parallel to the magnetization of the pinned layer. When the current is passed from the current supply terminal 108 to the current supply terminal 107, the magnetic domain wall 110 is moved toward the pinned magnetization layer 106 such that the magnetization direction of the region of the magnetization switching region 104 immediately above the pinned layer 101 and the non-magnetic layer 102 becomes antiparallel to the magnetization of the pinned layer.

This system is advantageous in that, because no current flows through the non-magnetic layer 102 at the time of writing, the withstand voltage of an insulator does not need to be considered even when an insulator represented by MgO is used for the non-magnetic layer, so that a highly reliable structure can be obtained. At the time of reading, a read current smaller than the write current such that the magnetic domain wall 110 is not moved is passed through the pinned layer 101, the non-magnetic layer 102, and the magnetic recording layer 103 via the current supply terminal 107 and the current supply terminal 109, or the current supply terminal 108 and the current supply terminal 109. As a result, a current path structure similar to that of a GMR or a TMR is established, and the resistance change can be read as bit information.

RELATED ART DOCUMENTS

Patent Document

Patent Document 1: Japanese Unexamined Patent Publication No. 2009-099625

Non-Patent Documents

Non-patent Document 1: S. Ikeda, J. Hayakawa, Y. Ashizawa, Y. M. Lee, K. Miura, H. Hasegawa, M. Tsunoda, F. Matsukura, H. Ohno, Appl. Phys. Lett., 93, 082508 (2008)
Non-patent Document 2: J. C. Slonczewski, J. Magn. Magn. Mater., 159, L1-L7 (1996)

SUMMARY OF THE INVENTION

Problems to be Solved by the Invention

In the MRAM utilizing magnetic domain wall motion, the absolute value of write current may possibly become relatively large. While a number of observations of magnetic domain wall motion have been reported besides Non-patent Document 2, magnetic domain wall motion generally requires a threshold current density of around $1 \times 10^8$ A/cm$^2$. In this case, the write current would be 1 mA even when the width of the magnetic recording layer in which magnetic domain wall motion occurs is 100 nm and the film thickness is 10 nm, for example.

On the other hand, in a magnetoresistance effect element in which a perpendicular magnetic anisotropy material with magnetic anisotropy perpendicular to a substrate plane is used for the pinned layer and the magnetic recording layer, a threshold current density on the order of $10^6$ A/cm$^2$ has been observed (see S. Mangin, D. Ravelosona, J. A. Katine, M. J. Carey, B. D. Terris and Eric E. Fullerton, Nature Mater., 5, 210 (2006), for example). In the MRAM utilizing magnetic domain wall motion, it is expected that the write current can be decreased by using a perpendicular magnetic anisotropy material for the magnetic recording layer. The perpendicular magnetic anisotropy material, because of its high thermal stability, provides the advantage of long retention time due to stabilized position of the magnetic domain wall. However, when a conventional perpendicular magnetic anisotropy material, such as FePt, a CoFe/Pd multilayer film, and TbFeCo, is used for the pinned layer and the magnetic recording layer 103, the resistance ratio is small because the coherent tunneling conduction via the $\Delta_1$ band does not occur even in a TMR structure using MgO for the non-magnetic layer. As a result, the bit information reading speed is lowered, since a high-speed read operation is generally considered to require a resistance ratio of 70% or more. Further, these materials are known to have a large damping constant α. Thus, the speed of movement of the magnetic domain wall may be decreased, with a resultant decrease in write speed.

An object of the present invention is to provide a magnetoresistance effect element in which bit information is written into a magnetic recording layer by magnetic domain wall motion, including a magnetic recording layer with perpendicular magnetic anisotropy, a large resistance ratio, and high speed of magnetic domain wall motion, and a magnetic random access memory.

Solutions to the Problems

In order to solve the problems, the magnetoresistance ratio is controlled by using a material including at least one type of 3d transition metal such as Co or Fe, or a Heusler alloy which is a half metal represented by Co$_2$MnSi and the like with spin polarizability of 100%, as the material of at least one of a pinned layer and a magnetic recording layer of a magnetoresistance effect element of magnetic domain wall motion type. Normally, when a magnetoresistance effect element is made from a material including at least one type of 3d transition metal, such as Co or Fe, that enables coherent tunneling conduction by the $\Delta_1$ band, or a Heusler alloy, the magnetization direction of the ferromagnetic layers is oriented parallel to film plane. However, the present inventors have developed a technology for achieving low threshold current density and high thermal stability factor by controlling the film thickness of the ferromagnetic layers on an atomic layer level such that the magnetization direction becomes perpendicular to film plane.

FIG. 2 shows the film thickness necessary for magnetization direction to become perpendicular to film plane versus the temperature of an annealing process included in a manufacturing process, in an example in which CoFeB is used for the ferromagnetic layers. CoFeB is one of materials that enable coherent tunneling conduction by the $\Delta_1$ band in a combination with MgO. In the example, annealing was performed for one hour. The white dots in the figure indicate upper limits of the film thickness, while the black dots indicate lower limits of the film thickness. As shown, the range of film thickness of CoFeB in which the magnetization direction becomes perpendicular to film plane varies in accordance with the annealing temperature.

The example of FIG. 2 is for CoFeB, and the relationship between the film thickness necessary for the magnetization direction to become perpendicular to film plane and the annealing temperature may differ from the example of FIG. 2 for a material including at least one type of other 3d transition metal, or a Heusler alloy. However, the magnetization direction can be changed from parallel to perpendicular to film plane by appropriately controlling the film thickness for the particular material. The film thickness necessary for the magnetization direction to become perpendicular to film plane may vary from one material to another but is generally 3 nm or less. The cause of the magnetization direction becoming perpendicular to film plane is thought to involve a specific change in anisotropy at the interface of CoFeB in the case of the example of FIG. 2. By making a thin film by controlling the film thickness of CoFeB on an atomic layer level, the ratio of the volume in which the interfacial effect is present to the volume of the CoFeB layer can be increased. As a result, the specific anisotropy effect at the interface is markedly exhibited, causing the magnetization direction to become perpendicular to film plane. It is thought that the effect is particularly pronounced at the interface between an oxygen-containing compound represented by MgO, Al$_2$O$_3$, SiO$_2$, and the like, and a ferromagnetic material including at least one type of 3d transition metal, such as Co or Fe, thereby causing the magnetization to be more easily oriented perpendicularly to film plane.

FIG. 3 shows the magnetoresistance ratio of the magnetoresistance effect element measured when a read current was passed through the pinned layer, the non-magnetic layer, and the magnetic recording layer, versus the annealing temperature in an example in which CoFeB was used for the pinned layer and the magnetic recording layer and MgO was used for the non-magnetic layer. As the annealing temperature is increased, the magnetoresistance ratio increases and exceeds 100% at 300° C. This is because, in the combination of CoFeB and MgO, coherent tunneling conduction via the $\Delta_1$ band occurs even when the anisotropy is changed to a perpendicular direction. Thus, in this example, annealing may be performed at approximately 250° C. for obtaining a magnetoresistance ratio of 70%, or at 300° C. for obtaining a magnetoresistance ratio of 100%. Thus, in order to obtain the magnetoresistance effect element with magnetization direction perpendicular to film plane when the annealing temperature is 300° C., the film thickness of the pinned layer and the magnetic recording layer may be controlled to be on the order of 1.0 nm to 1.6 nm according to FIG. 2.

Even when a material including at least one type of other 3d transition metal is used, the magnetoresistance effect element with a desired magnetoresistance ratio and magnetization direction perpendicular to film plane can be made by investigating the relationship between the annealing temperature and the magnetoresistance ratio in advance, as long as the coherent conduction via the $\Delta_1$ band can be achieved. Generally, when a Heusler alloy is used, the spin polarizability is originally 100%, so that the magnetoresistance effect element with a high magnetoresistance ratio and magnetization direction perpendicular to film plane can be made.

FIG. 4 shows changes in resistance of the magnetoresistance effect element versus a magnetic field applied perpendicularly to film plane, in the case in which CoFeB was used for the pinned layer and the magnetic recording layer and MgO was used for the non-magnetic layer. The peaks on the plus side of magnetic field values in FIG. 4 are the peaks that appear when the magnetic field is swept from the minus direction to the plus direction. The peaks on the minus side of magnetic field values are the peaks that appear when the magnetic field is swept from the plus direction to the minus direction. In the illustrated example, the annealing temperature was 300° C. It can be seen from the experimental result that the magnetization direction is perpendicular to film plane. At this time, the magnetoresistance ratio was 100%. In the magnetoresistance effect element formed from these materials, no decrease in read speed is caused, and high thermal stability and long retention time can be obtained due to perpendicular magnetic anisotropy.

FIG. 5 shows the CoFeB film thickness dependency of the damping constant α of CoFeB. As seen from the figure, the damping constant α of a range such that the anisotropy is perpendicular to film plane is smaller than the damping constant α of conventionally known perpendicular anisotropy material, which is on the order of 0.1. Thus, the decrease in speed of movement of the magnetic domain wall can be suppressed, and a sufficiently high write speed can be achieved. Similar advantages can be obtained when a Heusler alloy is used because of its sufficiently small damping constant α, as described by M. Oogane, T. Wakita, S. Yakata, R. Yilgin, Y. Ando, A. Sakuma, and T. Miyazaki in Jpn. J. Appl. Phys., 45, 3889 (2006).

Effects of the Invention

By applying the present invention, a magnetoresistance effect element of a magnetic domain wall motion type MRAM that has a large magnetoresistance ratio and a perpendicular magnetization direction with respect to film plane can be easily made. When the magnetoresistance ratio is desired to be controlled, the annealing temperature may be controlled, and the magnetoresistance effect element can be made in which the perpendicular magnetization direction with respect to film plane is maintained by adjusting the film thickness of the pinned layer and the magnetic recording layer formed with the non-magnetic layer sandwiched therebetween. Further, by applying the present invention, magnetic anisotropy can be easily controlled by controlling the film thickness of the pinned layer and the magnetic recording layer. Further, a high magnetoresistance ratio and low damping constant α can be obtained, so that high-speed read and write operations can be performed.

MODE FOR CARRYING OUT THE INVENTION

In the following, a magnetic domain wall motion type MRAM according to the present invention and a magnetoresistance effect element used in a memory cell of the magnetic domain wall motion type MRAM as a recording element will be described in detail with reference to the drawings.

First Embodiment

Figure 6:
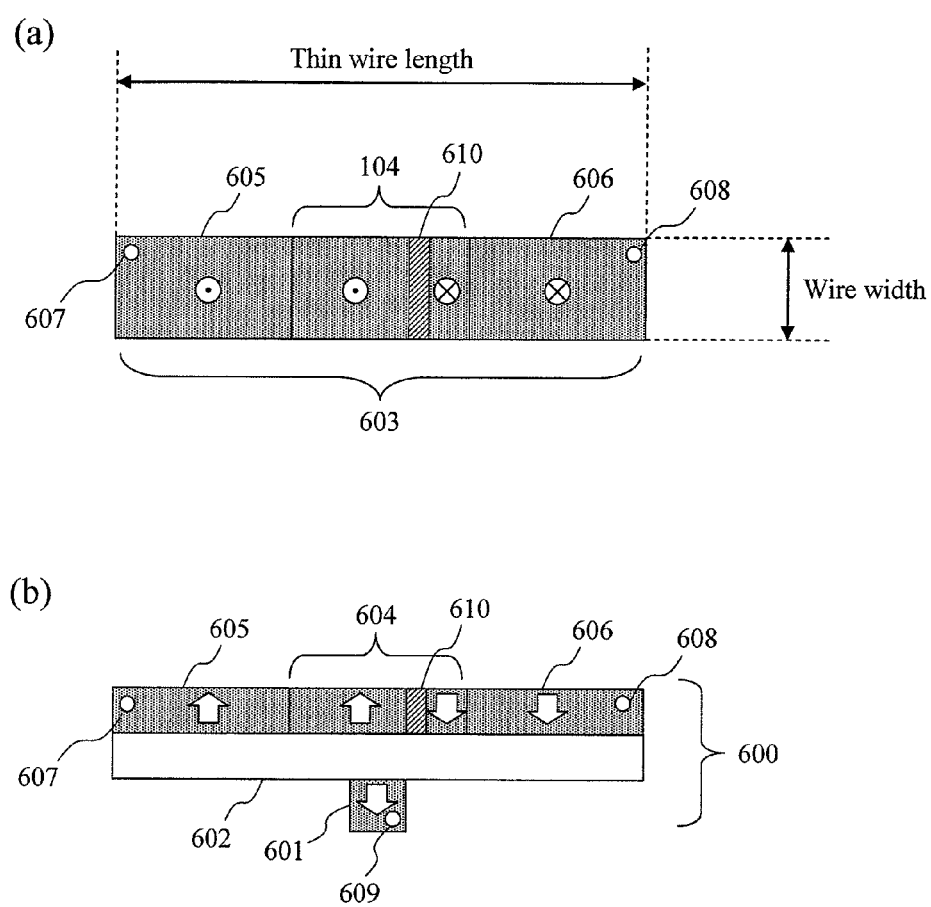
FIG. 6 includes a schematic plan view and a schematic cross sectional view of an example of the magnetoresistance effect element according to the present invention.

FIG. 6 schematically shows an example of the magnetoresistance effect element according to the present invention, (a) being a schematic plan view and (b) being a schematic cross sectional view.

According to an aspect of the present invention, a magnetoresistance effect element 600, as shown in FIG. 6, is provided with a pinned layer 601 which is a ferromagnet with fixed magnetization; a non-magnetic layer 602 stacked on the pinned layer; and a ferromagnetic magnetic recording layer 603 stacked on the non-magnetic layer 602. The non-magnetic layer 602 and the magnetic recording layer 603 have a thin wire shape. The material of the pinned layer 601 and the magnetic recording layer 603 is preferably a ferromagnetic material including at least one type of 3d transition metal element, such as Co or Fe, or a Heusler alloy represented by $Co_2MnSi$ and the like. The material of the non-magnetic layer 602 is preferably a material such that the magnetoresistance ratio can be increased; candidates are an oxygen-containing compound such as MgO, $Al_2O_3$, $SiO_2$, and the like, and a metal such as Cu. In the present example, the material of the pinned layer 601 and the magnetic recording layer 603 is CoFeB, while the material of the non-magnetic layer 602 is MgO.

Figure 1:
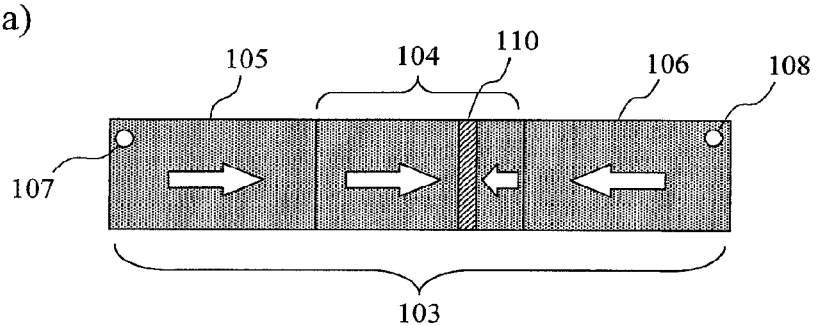
FIG. 1(a) is a plan view of a magnetoresistance effect element used as a recording element in a memory cell of a magnetic domain wall motion type MRAM.
FIG. 1(b) is a cross-sectional view of the magnetoresistance effect element.
Figure 1:
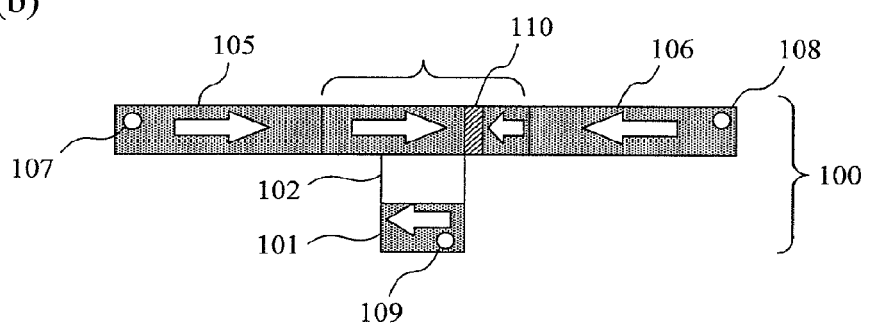
Figure 2:
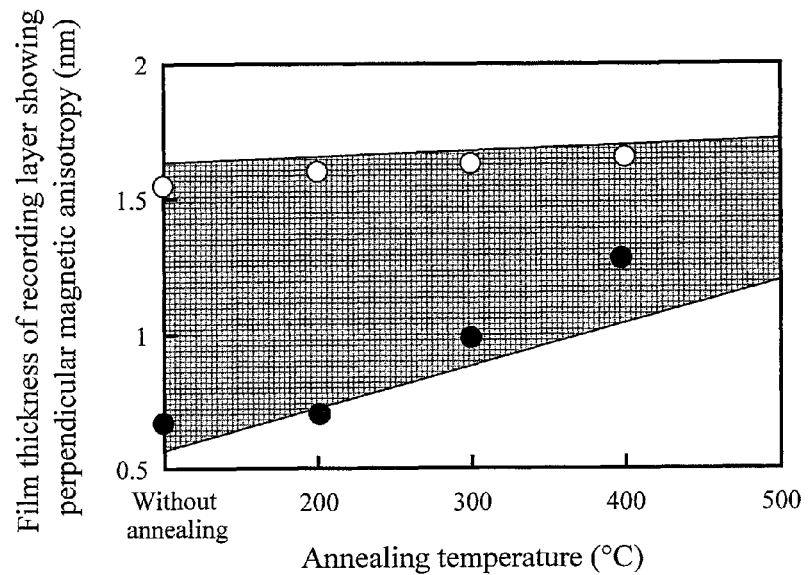
FIG. 2 shows changes in film thickness necessary for the magnetization direction of the magnetoresistance effect element to become perpendicular to film plane versus the annealing process temperature in a case in which CoFeB is used for a pinned layer and a magnetic recording layer.
Figure 3:
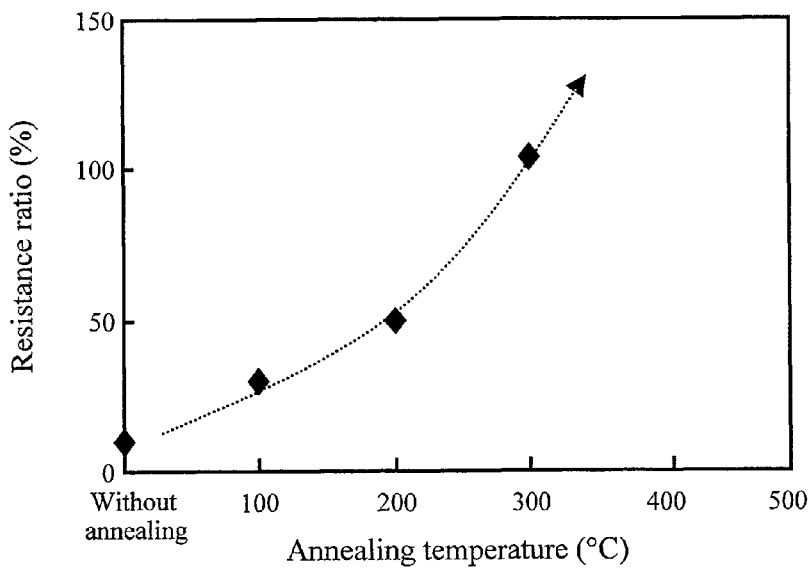
FIG. 3 shows changes in the magnetoresistance ratio of the magnetoresistance effect element versus the annealing process temperature in the case in which CoFeB is used for the pinned layer and the magnetic recording layer.
Figure 4:
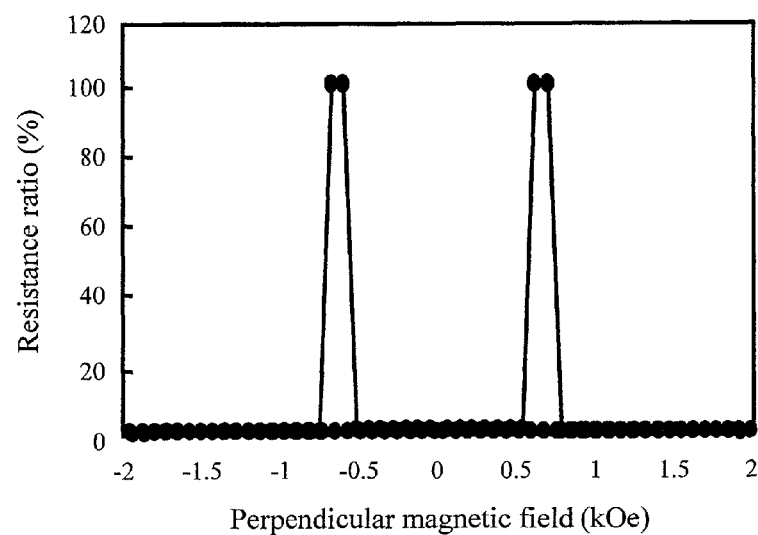
FIG. 4 shows changes in resistance of the magnetoresistance effect element versus the application of a magnetic field perpendicularly to film plane in the case in which CoFeB is used for the pinned layer and the magnetic recording layer.

As shown in FIG. 2, by controlling the film thickness of the pinned layer 601 and the magnetic recording layer 603 to be on the order of 1.0 nm to 1.6 nm, the magnetizations of the pinned layer 601 and the magnetic recording layer 603 can be made perpendicular to film plane at the annealing temperature of 300° C. In this case, the magnetoresistance ratio of 100% or more can be achieved, as shown in FIG. 3. In the example of FIG. 6, the pinned layer 601 has a circular planar shape measuring 40 nm in diameter. As the planar shape for the pinned layer 601, a square, rectangular, or elliptical shape may be considered. Preferably, however, a circular shape with no magnetic anisotropy in a direction parallel to film plane is employed. The thin wire of the magnetic recording layer 603 has a wire width of 40 nm. The magnetization switching region 604 has a thin wire length of 150 nm. This is so that the magnetic domain wall 610 can be moved in a range wider than a region immediately above the pinned layer 601 and the non-magnetic layer 602 because, if the magnetic domain wall 610 stops in the region immediately above the pinned layer 601 and the non-magnetic layer 602, bit information may not be accurately read at the time of reading. Thus, the condition needs to be satisfied that the length of the thin wire of the magnetization switching region 604 be greater than {(diameter of pinned layer 601)+2×(width of magnetic domain wall)}. The pinned magnetization regions 605 and 606 have a thin wire length of 150 nm. The pinned magnetization regions 605 and 606 are provided with magnetizations which are mutually oppositely oriented and strongly fixed. This ensures that the magnetization is switched at least once in the magnetization switching region 604. Accordingly, in the magnetization switching region 604, one or more 180° magnetic domain walls exist without fail.

To the pinned magnetization regions 605 and 606, current supply terminals 607 and 608, respectively, are joined. Via the current supply terminals 607 and 608, a write current flows through the magnetization switching region 604 and the pinned magnetization regions 605 and 606 of the magnetic recording layer 603. When there are two or more magnetic domain walls in the magnetization switching region 604, a write current may be passed through the magnetization switching region 604 and the pinned magnetization regions 605 and 606 so as to move the plurality of magnetic domain walls to one end of the magnetization switching region 604, so that the plurality of magnetic domain walls can be eliminated and only one magnetic domain wall exists in the magnetization switching region 604 without fail. By this method, only one magnetic domain wall 610 can be introduced into the magnetization switching region 604. The non-magnetic layer 602 is designed with the same width and length as those of the magnetic recording layer 603.

With regard to writing in the example of FIG. 6, when a current is passed from the current supply terminal 607 to the current supply terminal 608, the magnetic domain wall 610 is moved toward the pinned magnetization layer 605 such that the magnetization direction of the region of the magnetization switching region 604 immediately above the pinned layer 601 and the non-magnetic layer 602 becomes parallel to the magnetization of the pinned layer. When the current is passed from the current supply terminal 608 to the current supply terminal 607, the magnetic domain wall 610 is moved toward the pinned magnetization layer 606 such that the magnetization direction of the region of the magnetization switching region 604 immediately above the pinned layer 601 and the non-magnetic layer 602 becomes antiparallel to the pinned layer.

With regard to reading, a read current smaller than the write current such that the magnetic domain wall 610 is not moved is passed through the pinned layer 601, the non-magnetic layer 602, and the magnetic recording layer 603 via the current supply terminal 607 and the current supply terminal 609, or via the current supply terminal 608 and the current supply terminal 609. In this way, a current path structure similar to that of a GMR or a TMR is established, so that the resistance change can be read as bit information.

Figure 7:
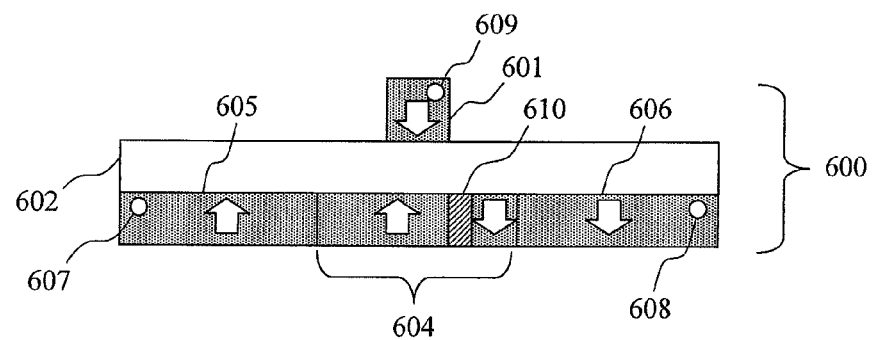
FIG. 7 is a schematic cross sectional view of an example of the magnetoresistance effect element according to the present invention.

In the example of FIG. 6, the pinned layer 601, the non-magnetic layer 602, and the magnetic recording layer 603 are successively stacked in this order. Preferably, the layers may be stacked in the order of the magnetic recording layer 603, the non-magnetic layer 602, and the pinned layer 601, as shown in the schematic cross sectional view of FIG. 7. Further, in the example of FIG. 6, the pinned layer 601 has downward magnetization, the pinned magnetization region 605 has upward magnetization, and the pinned magnetization region 606 has downward magnetization. However, the magnetization directions are not particularly limited and the magnetization directions may be fixed in such a way that the manufacture can be facilitated, as long as the magnetization directions of the pinned magnetization region 605 and the pinned magnetization region 606 are antiparallel to each other.

The material of the pinned layer 601 may be a conventionally known perpendicular magnetic anisotropy material, such as FePt, and the material of the magnetic recording layer 603 may be CoFeB. In this case, the magnetoresistance ratio may be decreased because coherent tunneling conduction via the $\Delta_1$ band cannot be achieved in the conventionally known perpendicular magnetic anisotropy material such as FePt; however, write and read operations can be performed. This configuration is advantageous in that the magnetic anisotropy of the pinned layer 601 can be controlled to be large compared with the magnetic recording layer 603. Further, the material of the pinned layer 601 may be CoFeB, and the material of the magnetic recording layer 603 may be a conventionally known perpendicular magnetic anisotropy material, such as FePt. In this configuration, too, write and read operations can be performed.

On the other hand, when the Heusler alloy $Co_2MnSi$ is used for the pinned layer 601 and the magnetic recording layer 603, the resistance ratio on the order of 70% can be obtained due to high spin polarizability. This value is smaller than the value in the case in which CoFeB is used for the pinned layer 601 and the magnetic recording layer 603. This is because, when $Co_2MnSi$ is used, coherent conduction via the $\Delta_1$ band is not markedly exhibited. However, a resistance ratio necessary for reading can be obtained. Because of the advantage of low damping constant, the speed of movement of the magnetic domain wall is higher than in the case in which CoFeB is used for the pinned layer 601 and the magnetic recording layer 603, so that a high-speed write operation can be performed.

Figure 8:
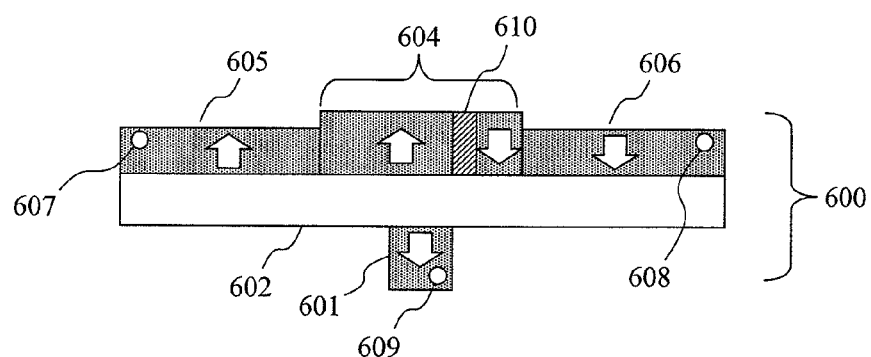
FIG. 8 is a schematic cross sectional view of an example of the magnetoresistance effect element according to the present invention.

According to another aspect of the present invention, the film thickness of the pinned magnetization regions 605 and 606 may be changed from the film thickness of the magnetization switching region 604 so as to strongly fix the magnetizations of the pinned magnetization regions 605 and 606. FIG. 8 is a cross-sectional view of an example in which the film thickness of the pinned magnetization regions 605 and 606 is decreased compared with the film thickness of the magnetization switching region 604. In the case of the material including at least one type of 3d transition metal, such as Co or Fe, or a Heusler alloy represented by $Co_2MnSi$ or the like, as applied for the pinned layer 601 and the magnetic recording layer 603 according to the present invention, magnetization direction can be changed from parallel to perpendicular to film plane by controlling the film thickness. Further, perpendicular magnetic anisotropy can also be easily controlled by changing the film thickness.

Figure 5:
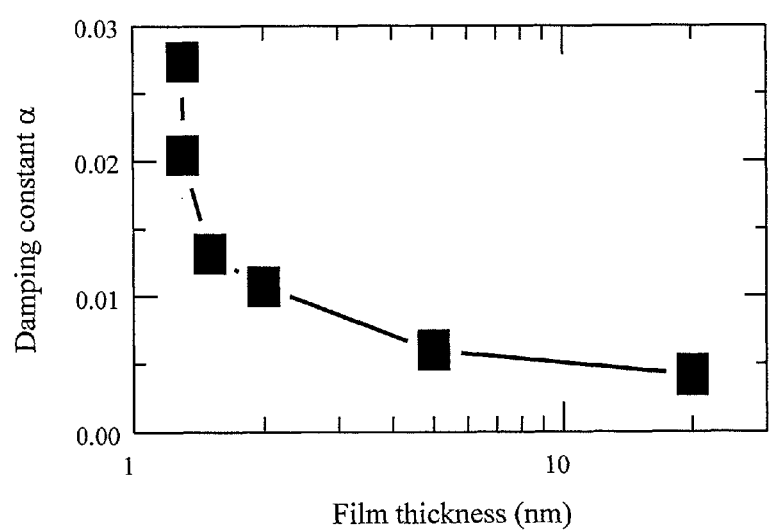
FIG. 5 shows the damping factor α versus the film thickness of CoFeB in the case in which CoFeB is used for the pinned layer and the magnetic recording layer.

In the example of FIG. 8, the perpendicular magnetic anisotropy of the pinned magnetization regions 605 and 606 is controlled to be larger than the perpendicular magnetic anisotropy of the magnetization switching region 604 such that the magnetization directions of the pinned magnetization regions 605 and 606 are strongly fixed. Thus, the magnetic domain wall 610 can be easily caused to remain in the magnetization switching region 604 without entering the pinned magnetization regions 605 and 606. Further, in the example of FIG. 8, the film thickness of the pinned magnetization regions 605 and 606 is controlled to be smaller than the film thickness of the magnetization switching region 604. In this case, as seen from FIG. 5, the damping constant $\alpha$ of the pinned magnetization regions 605 and 606 is larger than that of the magnetization switching region 604. Thus, the speed of magnetic domain wall motion in the pinned magnetization regions 605 and 606 is smaller than in the magnetization switching region 604. Accordingly, even if the magnetic domain wall 610 enters the pinned magnetization region 605 or 606, the magnetic domain wall 610 can be easily stopped around the interface between the magnetization switching region 604 and the pinned magnetization region 605 or 606 due to the low speed of movement of the magnetic domain wall 610.

In the example of FIG. 8, the film thickness of the pinned layer 601 and the magnetization switching region 604 is 1.3 nm, and the film thickness of the pinned magnetization regions 605 and 606 is 1.0 nm. The planar shape of the pinned layer 601 is circular measuring 40 nm in diameter. The thin wire of the magnetic recording layer 603 has the wire width of 40 nm. The magnetization switching region 604 has the thin wire length of 150 nm. The pinned magnetization regions 605 and 606 have the thin wire length of 150 nm.

Figure 9:
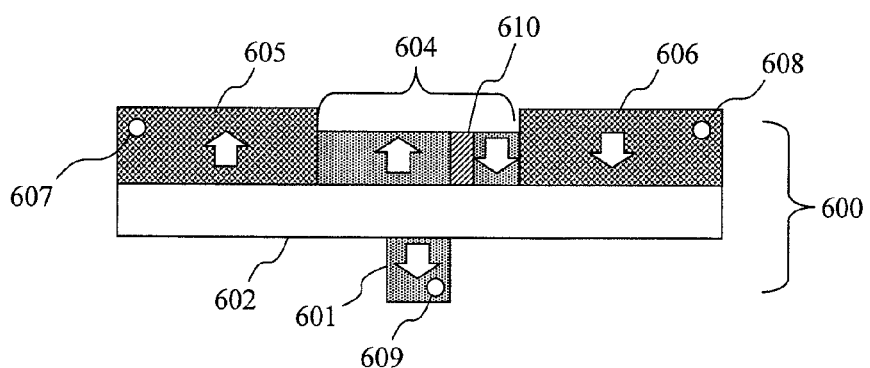
FIG. 9 is a schematic cross sectional view of an example of the magnetoresistance effect element according to the present invention.

According to another aspect of the present invention, for the magnetization switching region 604 of the magnetic recording layer 603, a material including at least one type of 3d transition metal such as Co or Fe, or a Heusler alloy represented by $Co_2MnSi$ and the like may be applied, and for the pinned magnetization regions 605 and 606, another conventionally known perpendicular magnetic anisotropy material, such as a multilayer film of Co and Pt, Ni and Pt, and the like, or an FePt or TbFeCo alloy, may be applied. FIG. 9 is a schematic cross sectional view of the magnetoresistance effect element 600 according to this aspect. By adopting this configuration, the perpendicular magnetic anisotropy of the pinned magnetization regions 605 and 606 can be made larger than the perpendicular magnetic anisotropy of the magnetization switching region 604 when the perpendicular magnetic anisotropy of the other conventionally known perpendicular magnetic anisotropy material such as the multilayer film of Co and Pt, Ni and Pt, and the like or the FePt or TbFeCo alloy is larger than the perpendicular magnetic anisotropy of the material including at least one type of 3d transition metal such as Co or Fe or the Heusler alloy represented by $Co_2MnSi$ and the like. In the example of FIG. 9, FePt is used as the material of the pinned magnetization regions 605 and 606, with the film thickness of 10 nm. The pinned layer 601 has a circular planar shape measuring 40 nm in diameter. The thin wire of the magnetic recording layer 603 has the wire width of 40 nm. The magnetization switching region 604 has the thin wire length of 150 nm. The pinned magnetization regions 605 and 606 have the thin wire length of 150 nm.

Figure 10:
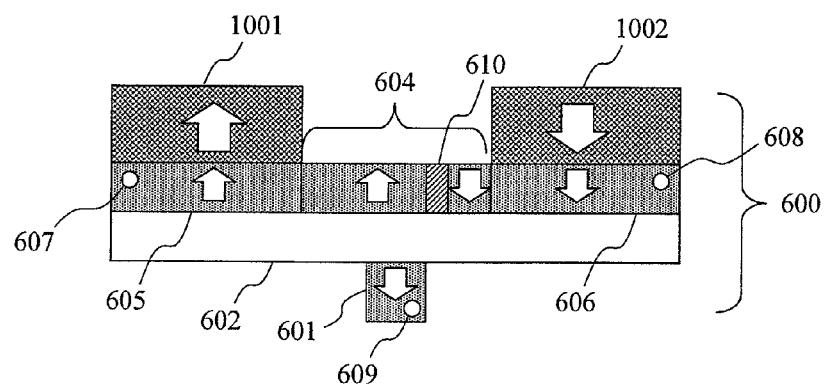
FIG. 10 is a schematic cross sectional view of an example of the magnetoresistance effect element according to the present invention.
Figure 11:
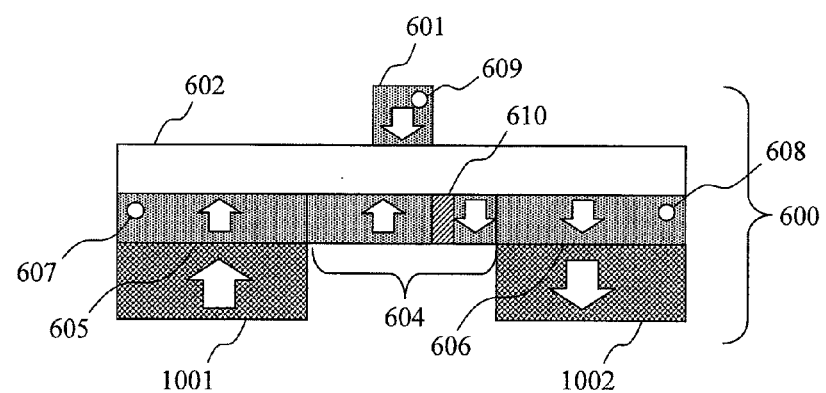
FIG. 11 is a schematic cross sectional view of an example of the magnetoresistance effect element according to the present invention.

According to another aspect of the present invention, ferromagnetic layers 1001 and 1002 may be formed on the interface of the pinned magnetization regions 605 and 606 of the magnetic recording layer 603 on the side opposite to the non-magnetic layer 602, in which another conventionally known perpendicular magnetic anisotropy material such as a multilayer film of Co and Pt, Ni and Pt, and the like, or an FePt or TbFeCo alloy is applied. FIG. 10 is a schematic cross sectional view of the magnetoresistance effect element 600 according to this aspect. By adopting this configuration, the perpendicular magnetic anisotropy of the pinned magnetization regions 605 and 606 can be increased because of ferromagnetic coupling of the perpendicular magnetic anisotropy of the pinned magnetization regions 605 and 606 with the ferromagnetic layers 1001 and 1002. While in the example of FIG. 10 the ferromagnetic layers 1001 and 1002 are formed over the pinned magnetization regions 605 and 606, the magnetic recording layer 603, the non-magnetic layer 602, and the pinned layer 601 may be successively stacked over the ferromagnetic layers 1001 and 1002 in this order, as shown in FIG. 11. Further, while in the examples of FIGS. 10 and 11 the current supply terminals 607 and 608 are connected to the pinned magnetization regions 605 and 606, the terminals may be connected to the ferromagnetic layers 1001 and 1002. In the examples of FIGS. 10 and 11, FePt is used as the material of the ferromagnetic layers 1001 and 1002, with the film thickness of 20 nm. The pinned layer 601 has a circular planar shape, with the diameter of 40 nm. The thin wire of the magnetic recording layer 603 has the wire width of 40 nm. The magnetization switching region 604 has the thin wire length of 150 nm. The pinned magnetization regions 605 and 606 have the thin wire length of 150 nm. A second ferromagnetic layer of a material with a larger damping constant than that of the pinned magnetization regions may be provided on the interface of the pinned magnetization regions on the side opposite to the non-magnetic layer. By the presence of the adjoining second ferromagnetic layer, the damping constant of the pinned magnetization regions can be increased.

Figure 12:
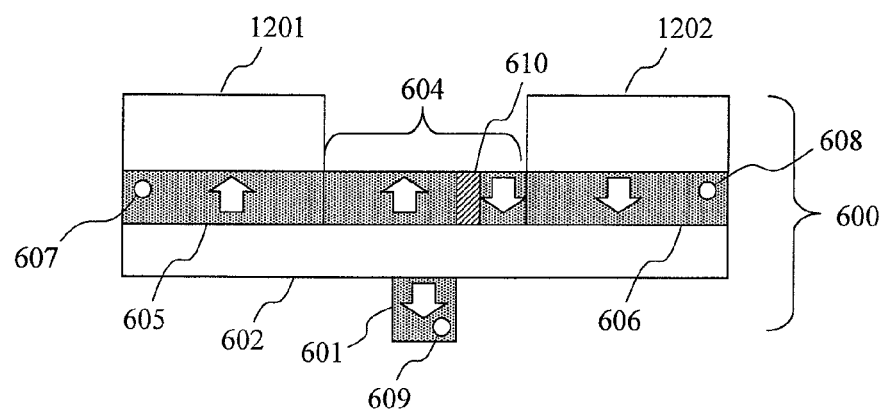
FIG. 12 is a schematic cross sectional view of an example of the magnetoresistance effect element according to the present invention.

According to another aspect of the present invention, second non-magnetic layers 1201 and 1202 in which an oxide such as MgO, $Al_2O_3$, $SiO_2$, and the like is applied may be formed on the interface of the pinned magnetization regions 605 and 606 of the magnetic recording layer 603 on the side opposite to the non-magnetic layer 602. FIG. 12 is a schematic cross sectional view of the magnetoresistance effect element 600 according to this aspect. The magnetic anisotropy of the material including at least one type of 3d transition metal such as Co or Fe, or a Heusler alloy represented by $Co_2MnSi$ and the like can be changed from parallel to perpendicular with respect to film plane by controlling their film thickness because of the specific anisotropy at the interface. This specific interfacial anisotropy is thought to be particularly exhibited at the interface with an oxide, such as MgO, $Al_2O_3$, and $SiO_2$. Thus, by adopting this configuration, the perpendicular magnetic anisotropy of the pinned magnetization regions 605 and 606 can be increased. The film thickness is 0.4 nm in the case in which MgO is used for the second non-magnetic layers 1201 and 1202, for example. In the second non-magnetic layers 1201 and 1202, a material with large spin orbit interaction represented by Pt and Pd may be applied. By adopting this configuration, the damping constant of the pinned magnetization regions 605 and 606 can be increased over the values shown in FIG. 5. As the damping constant is increased, the speed of movement of the magnetic domain wall 610 is sharply decreased as the magnetic domain wall 610 enters the pinned magnetization region 605 or 606. Thus, the magnetic domain wall 610 can be stopped at the boundary between the magnetization switching region 604 and the pinned magnetization region 605 or 606. The film thickness is 2 nm when Pt is used for the second non-magnetic layer, for example. The pinned layer 601 has a circular planar shape measuring 40 nm in diameter. The thin wire of the magnetic recording layer 603 has the wire width of 40 nm. The magnetization switching region 604 has the thin wire length of 150 nm. The pinned magnetization regions 605 and 606 have the thin wire length of 150 nm.

Figure 13:
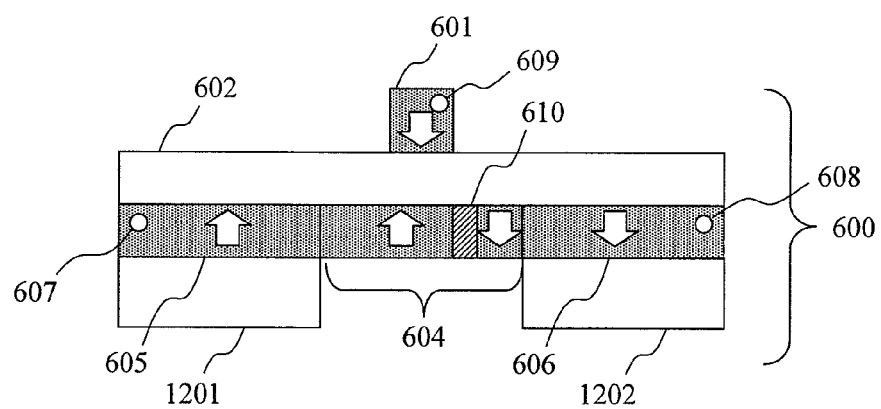
FIG. 13 is a schematic cross sectional view of an example of the magnetoresistance effect element according to the present invention.

In the example of FIG. 12, the second non-magnetic layers 1201 and 1202 are formed over the pinned magnetization regions 605 and 606. Preferably, the magnetic recording layer 603, the non-magnetic layer 602, and the pinned layer 601 may be successively stacked over the second non-magnetic layers 1201 and 1202 in this order, as shown in FIG. 13. While in the examples of FIGS. 12 and 13 the current supply terminals 607 and 608 are connected to the pinned magnetization regions 605 and 606, the terminals may be connected to the pinned magnetization regions 605 and 606 via the second non-magnetic layers 1201 and 1202.

Figure 14:
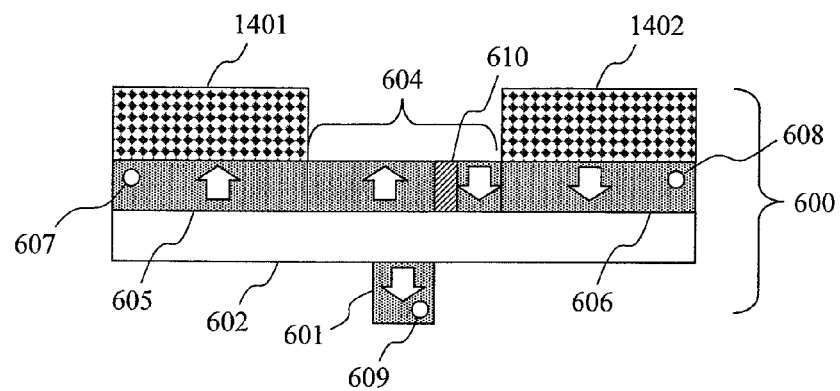
FIG. 14 is a schematic cross sectional view of an example of the magnetoresistance effect element according to the present invention.

According to another aspect of the present invention, antiferromagnetic layers 1401 and 1402 may be formed on the interface of the pinned magnetization regions 605 and 606 of the magnetic recording layer 603 on the side opposite to the non-magnetic layer 602. FIG. 14 is a schematic cross sectional view of the magnetoresistance effect element 600 according to this aspect. By adopting this configuration, the magnetizations of the pinned magnetization regions 605 and 606 can be strongly fixed because of exchange coupling with the antiferromagnetic layers 1401 and 1402. The film thickness is 5 nm when IrMn is used for the antiferromagnetic layers 1401 and 1402, for example. The pinned layer 601 has a circular planar shape measuring 40 nm in diameter. The thin wire of the magnetic recording layer 603 has the wire width of 40 nm. The magnetization switching region 604 has the thin wire length of 150 nm. The pinned magnetization regions 605 and 606 have the thin wire length of 150 nm.

Figure 15:
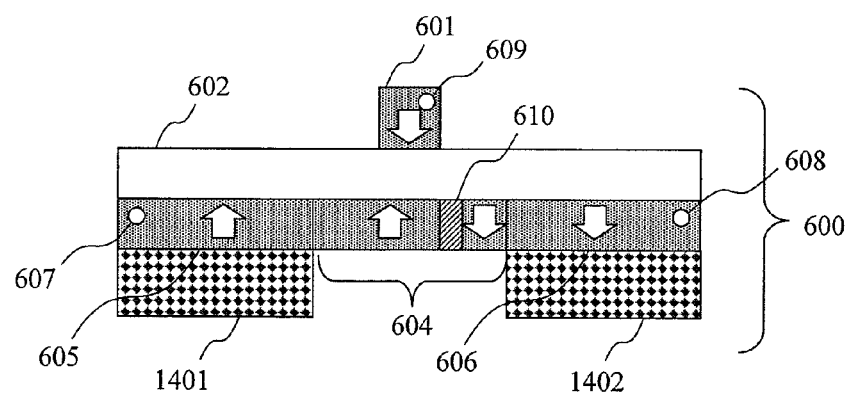
FIG. 15 is a schematic cross sectional view of an example of the magnetoresistance effect element according to the present invention.

In the example of FIG. 14 the antiferromagnetic layers 1401 and 1402 are formed over the pinned magnetization regions 605 and 606. Preferably, the magnetic recording layer 603, the non-magnetic layer 602, and the pinned layer 601 may be stacked successively in this order over the antiferromagnetic layers 1401 and 1402, as shown in FIG. 15. While in the examples of FIGS. 14 and 15 the current supply terminals 607 and 608 are connected to the pinned magnetization regions 605 and 606, the terminals may be connected to the pinned magnetization regions 605 and 606 via the antiferromagnetic layers 1401 and 1402.

Figure 16:
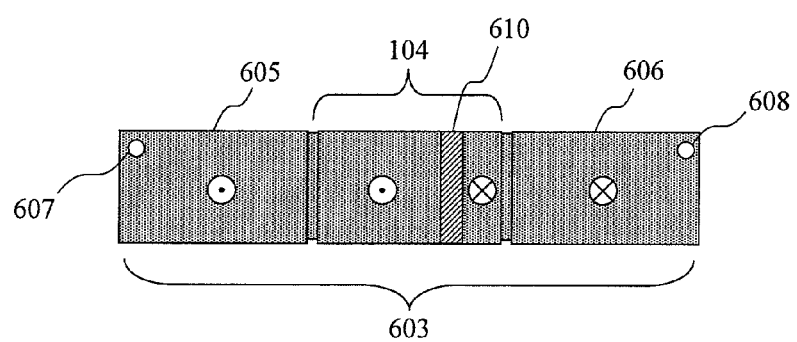
FIG. 16 includes a schematic plan view and a schematic cross sectional view of the magnetoresistance effect element according to the present invention.
Figure 16:
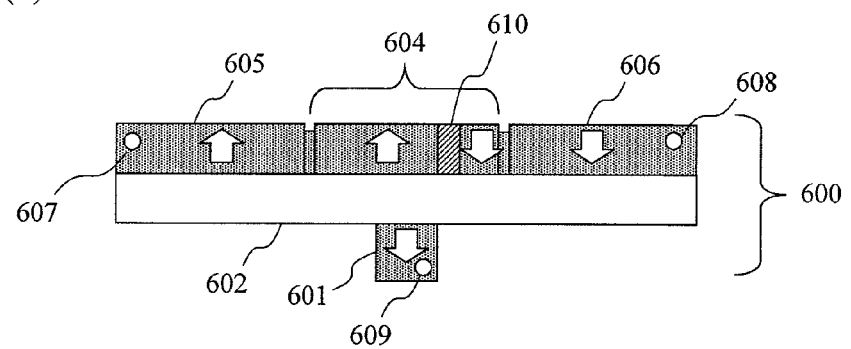

According to another aspect of the present invention, a structure may be adopted such that the magnetic recording layer 603 has constrictions at the boundary of the magnetization switching region 604 and the pinned magnetization regions 605 and 606. FIG. 16 shows the magnetoresistance effect element 600 according to this aspect. FIG. 16(a) is a schematic plan view, while FIG. 16(b) is a schematic cross sectional view. By applying this configuration, the magnetic domain wall 610 is strongly pinned by the constrictions such that the magnetic domain wall 610 does not enter the pinned magnetization regions 605 and 606. In the example of FIG. 16, the film thickness of the pinned layer 601 and the magnetic recording layer is 1.3 nm, while the film thickness at the constriction portions is 1.0 nm. The pinned layer 601 has a circular planar shape measuring 40 nm in diameter. The thin wire of the magnetic recording layer 603 has the wire width of 40 nm. The magnetization switching region 604 has the thin wire length of 150 nm. The constriction portions have the wire width of 38 nm.

Figure 17:
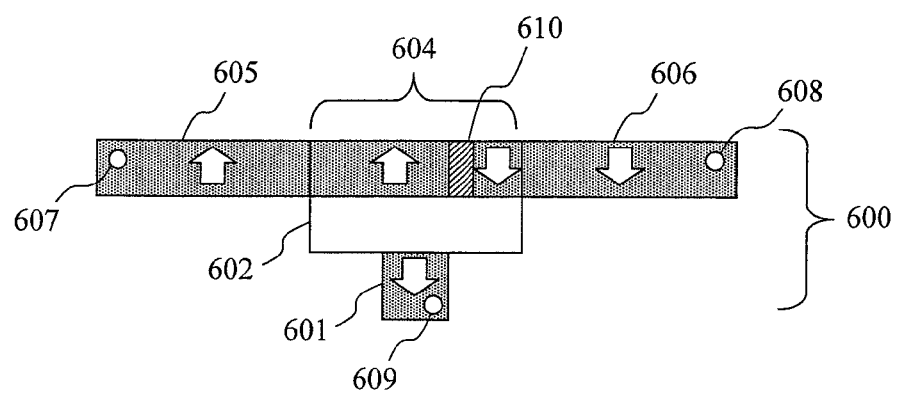
FIG. 17 is a schematic cross sectional view of an example of the magnetoresistance effect element according to the present invention.

According to another aspect of the present invention, the magnetoresistance effect element 600 may be configured such that the non-magnetic layer 602 adjoins only the magnetization switching region 604 of the magnetic recording layer 603. FIG. 17 shows the magnetoresistance effect element 600 according to this aspect. In this case, the non-magnetic layer 602 adjoins neither the pinned magnetization region 605 nor 606. The anisotropy of the material including at least one type of 3d transition metal such as Co or Fe, or the Heusler alloy represented by $Co_2MnSi$ and the like, can be changed from parallel to perpendicular with respect to film plane by controlling their film thickness, supposedly because of specific interfacial anisotropy. This specific anisotropy is particularly exhibited at the interface between such ferromagnets and an oxide represented by MgO. Thus, according to the present embodiment, the magnetoresistance effect element 600 has perpendicular magnetic anisotropy only in the magnetization switching region 604, with the pinned magnetization regions 605 and 606 having in-plane magnetic anisotropy. By adopting this configuration, a 90° magnetic domain wall is introduced between the pinned magnetization regions 605 and 606 and the magnetization switching region 604. When the magnetic domain wall 610 in the magnetization switching region 604 is present at the end of the magnetization switching region 604, the electron spins that provide spin-transfer torque to the magnetization of the magnetization switching region 604 are inclined by 90°, possibly resulting in an increase in the torque and a decrease in write current. In the case of this configuration, too, the magnetic domain wall 610 is stopped within the magnetization switching region 604 and does not enter the pinned magnetization region 605 or 606.

Second Embodiment

Figure 18:
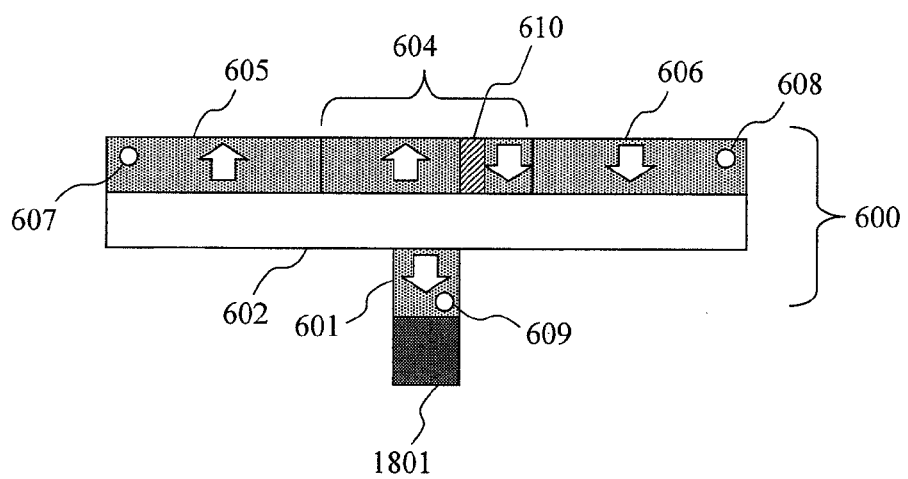
FIG. 18 is a schematic cross sectional view of an example of the magnetoresistance effect element according to the present invention.

According to another aspect of the present invention, the magnetoresistance effect element 600 according to the first embodiment may include a pinned magnetization layer 1801 formed on the interface of the pinned layer 601 on the side opposite to the non-magnetic layer 602 by stacking another conventionally known perpendicular magnetic anisotropy material, such as a multilayer film of Co and Pt, Ni and Pt, and the like, or an FePt or TbFeCo alloy, so as to increase and strongly fix the perpendicular magnetic anisotropy of the pinned layer 610. FIG. 18 shows the magnetoresistance effect element 600 according to this aspect. By adopting this configuration, the perpendicular magnetic anisotropy of the pinned layer 601 can be increased by the ferromagnetic coupling with the perpendicular magnetic anisotropy material. The film thickness is 20 nm when FePt is used for the pinned magnetization layer 1801, for example. For the same purpose, an antiferromagnetic layer may be stacked on the interface of the pinned layer 601 on the side opposite to the non-magnetic layer 602. In this case, the perpendicular magnetic anisotropy of the pinned layer 601 is increased by its exchange coupling with the antiferromagnetic layer. The film thickness is 5 nm when IrMn is used for the pinned magnetization layer 1801, for example. Further, an oxide layer of MgO, $Al_2O_3$, $SiO_2$, and the like may be stacked on the interface of the pinned layer 601 on the side opposite to the non-magnetic layer 602. In this case, the perpendicular magnetic anisotropy is increased due to the specific anisotropy at the interface with the pinned layer 601. The film thickness is 0.4 nm when MgO is used for the pinned magnetization layer 1801, for example. A material with large spin orbit interaction represented by Pt and Pd may be stacked on the interface of the pinned layer 601 on the side opposite to the non-magnetic layer 602. In this case, although the damping constant α of the pinned layer 601 is increased such that the perpendicular magnetic anisotropy is not changed, magnetization switching of the pinned layer 601 by current is made difficult to occur. Thus, the possibility of erroneously switching the magnetization of the pinned layer 601 by read current can be decreased. The film thickness is 2 nm when Pt is used for the pinned magnetization layer 1801, for example.

Third Embodiment

According to another aspect of the present invention, a magnetic domain wall motion type MRAM can be obtained by adopting the magnetoresistance effect element 600 according to the first or the second embodiment as a storage element.

Figure 19:
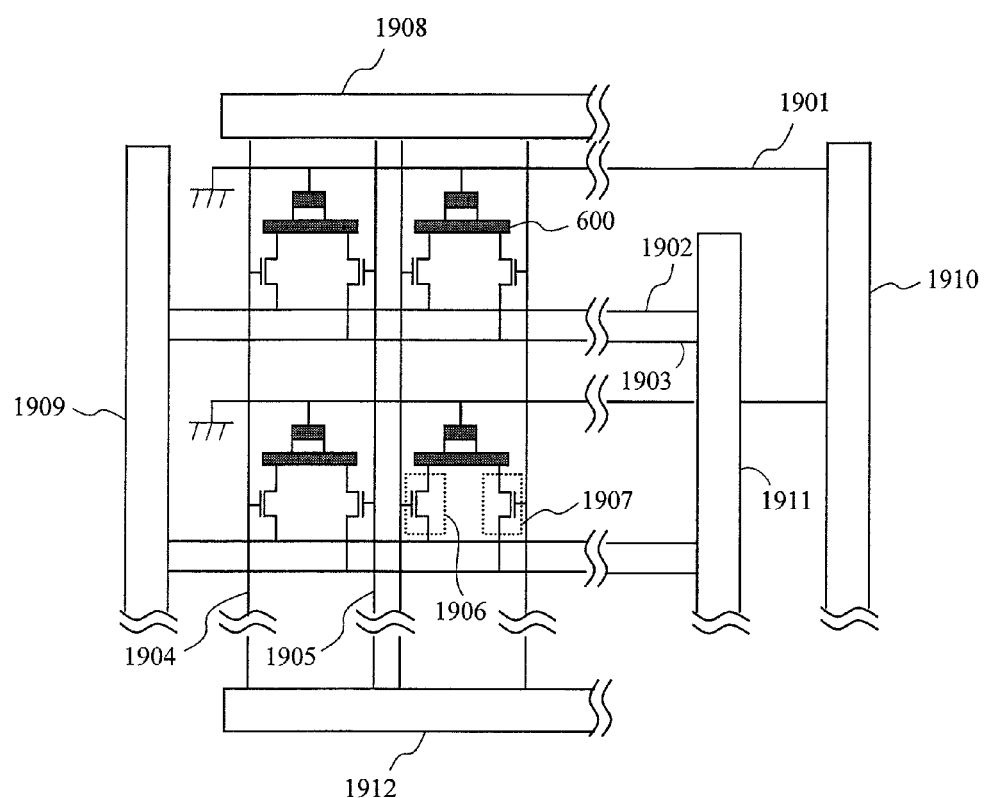
FIG. 19 is a conceptual diagram of an example of a magnetic domain wall motion type MRAM according to the present invention.

As shown in FIG. 19, the magnetic domain wall motion type MRAM according to the present invention is provided with two selection transistors for each magnetoresistance effect element 600, and include a plurality of bit lines 1901 disposed in parallel to each other; a plurality of first source lines 1902 disposed in parallel to the bit lines 1901 and parallel to each other; and a plurality of second source lines 1903 disposed in parallel to the bit lines 1901 and the first source lines 1902 and parallel to each other. The magnetic domain wall motion type MRAM also includes first word lines 1904 disposed perpendicularly to the bit lines 1901, the first source lines 1902, and the second source lines 1903 and in parallel to each other; and second word lines 1905 disposed perpendicularly to the bit lines 1901, the first source lines 1902, and the second source lines 1903, in parallel to the first word lines 1904, and in parallel to each other.

At each point of intersection of the first source lines 1902 and the first word lines 1904, a first selection transistor 1906 is disposed. The first source lines 1902 are electrically connected to a source electrode of the first selection transistor 1906. The first word lines 1904 are electrically connected to a gate electrode of the first selection transistor 1906. A drain electrode of the first selection transistor 1906 is electrically connected to the current supply terminal 607 of the magnetoresistance effect element 600. At each point of intersection of the second source lines 1903 and the second word lines 1905, a second selection transistor 1907 is disposed. The second source lines 1903 are electrically connected to a source electrode of the second selection transistor 1907. The second word lines 1905 are electrically connected to a gate electrode of the second selection transistor 1907. A drain electrode of the second selection transistor 1907 is electrically connected to the current supply terminal 608 of the magnetoresistance effect element 600. The bit lines 1901 are electrically connected to the pinned layer 601 of the magnetoresistance effect element 600. Selection circuits 1908 and 1909, and current applying circuits 1910, 1911, and 1912 are also connected. By adopting this configuration, a memory cell of the magnetic domain wall motion type MRAM can be obtained.

A write operation for the memory cell will be described. When writing by selecting a particular memory cell, a voltage is applied to the first word line 1904 and the second word line 1905 while a voltage is applied to the first source line 1902 or the second source line 1903 of the selected memory cell. At this time, the first selection transistor 1906 and the second selection transistor 1907 of the selected memory cell are in an on-state, so that a current flows through the magnetoresistance effect element 600 from one of the first source line 1902 and the second source line 1903 to which the voltage was applied, to the other. At this time, because the current flows through the magnetization switching region 604 of the magnetoresistance effect element, the magnetic domain wall 610 can be moved in one direction. When writing different information, the source line to which the voltage is applied is reversed between the first source line 1902 and the second source line 1903 such that the current flows through the magnetization switching region 604 in the opposite direction, thus causing the magnetic domain wall 610 to be moved in the opposite direction. For example, when the voltage is applied to the first source line 1902, the current flows from the first source line 1902 to the second source line 1903. When the magnetoresistance effect element shown in FIG. 6 is adopted as the magnetoresistance effect element 600, the electrons move from the right to left of the magnetization switching region 604 shown in FIG. 6, so that the magnetic domain wall 610 is also moved from right to left. At this time, the direction of magnetization of the region of the magnetization switching region 604 immediately above the pinned layer 601 becomes parallel to the direction of magnetization of the pinned layer 601, so that information in a "0" state can be written. On the other hand, a "1" state can be written by applying the voltage to the second source line 1903. For a read operation, a voltage is applied to the first word line 1904 while a voltage smaller than that for writing is applied to the first source line 1902. At this time, the first selection transistor 1906 is placed in an on-state and current flows from the first source line 1902 to a bit line 1901, so that the resistance value of the magnetoresistance effect element 600 can be read. Reading may be performed by applying voltage to the second source line 1903 and the second word line 1905.

DESCRIPTION OF REFERENCE SIGNS

100 Magnetoresistance effect element
101 Pinned layer
102 Non-magnetic layer
103 Magnetic recording layer
104 Magnetization switching region
105, 106 Pinned magnetization region
107 to 109 Current supply terminal
110 Magnetic domain wall
600 Magnetoresistance effect element
601 Pinned layer
602 Non-magnetic layer
603 Magnetic recording layer
604 Magnetization switching region
605, 606 Pinned magnetization region
607 to 609 Current supply terminal
610 Magnetic domain wall
1001, 1002 Ferromagnetic layer
1201, 1202 Second ferromagnetic layer
1401, 1402 Antimagnetic layer
1801 Pinned magnetization layer
1901 Bit line
1902 First source line
1903 Second source line
1904 First word line
1905 Second word line
1906 First selection transistor
1907 Second selection transistor
1908, 1909 Selection circuit
1910 to 1912 Current applying circuit

The invention claimed is:

1. A magnetoresistance effect element comprising:
a pinned layer of a ferromagnet with a fixed magnetization direction;
a magnetic recording layer of a ferromagnet with a thin wire shape including a region with a variable magnetization direction; and
a non-magnetic layer with a thin wire shape formed between the pinned layer and the magnetic recording layer,
wherein:
the magnetic recording layer includes three regions consisting of pinned magnetization regions at the ends and a magnetization switching region sandwiched therebetween;
the pinned layer and the pinned magnetization regions include current supply terminals; and
at least one of the pinned layer and the magnetic recording layer is formed from a ferromagnet enabling a magnetization direction to be changed from parallel to perpendicular to a film plane by controlling a film thickness to be not more than 3 nm, with a controlled magnetoresistance ratio and with the magnetization direction perpendicularly oriented with respect to the film plane by a film thickness control.

2. The magnetoresistance effect element according to claim 1, wherein the non-magnetic layer adjoins the three regions of the magnetic recording layer.

3. The magnetoresistance effect element according to claim 1, wherein the film thickness of the pinned magnetization regions and the magnetization switching region is controlled such that the perpendicular magnetic anisotropy of the pinned magnetization regions is greater than the perpendicular magnetic anisotropy of the magnetization switching region.

4. The magnetoresistance effect element according to claim 1, wherein the material of the pinned magnetization regions and the magnetization switching region is selected such that the perpendicular magnetic anisotropy of the pinned magnetization regions is greater than the perpendicular magnetic anisotropy of the magnetization switching region.

5. The magnetoresistance effect element according to claim 1, comprising a ferromagnetic layer disposed on an interface of the pinned magnetization regions on a side opposite to the non-magnetic layer, the ferromagnetic layer being formed from a material with a perpendicular magnetic anisotropy greater than the perpendicular magnetic anisotropy of the pinned magnetization regions,
wherein the magnetization of the pinned magnetization regions and the magnetization of the ferromagnetic layer are coupled by ferromagnetic coupling.

6. The magnetoresistance effect element according to claim 1, comprising a second non-magnetic layer on an interface of the pinned magnetization regions on a side opposite to the non-magnetic layer,
wherein the perpendicular magnetic anisotropy of the pinned magnetization regions is greater than the perpendicular magnetic anisotropy of the magnetization switching region.

7. The magnetoresistance effect element according to claim 1, comprising a second ferromagnetic layer on an interface of the pinned magnetization regions on a side opposite to the non-magnetic layer,
wherein:
the second ferromagnetic layer is of a material with a damping constant greater than the damping constant of the pinned magnetization regions; and
the damping constant of the pinned magnetization regions is increased by the second ferromagnetic layer adjoining the pinned magnetization regions.

8. The magnetoresistance effect element according to claim 1, comprising an antiferromagnetic layer on an interface of the pinned magnetization regions on a side opposite to the non-magnetic layer,
wherein the magnetization of the pinned magnetization regions and the magnetization of the antiferromagnetic layer are coupled by exchange coupling.

9. The magnetoresistance effect element according to claim 1, wherein:
the non-magnetic layer has the same length as the magnetization switching region and adjoins the magnetization switching region; and
the pinned magnetization regions have magnetization parallel to the film plane.

10. The magnetoresistance effect element according to claim 1, comprising a constriction structure at a boundary between the pinned magnetization regions and the magnetization switching region.

11. The magnetoresistance effect element according to claim 1, comprising an antiferromagnetic, ferromagnetic, or non-magnetic layer on an interface of the pinned layer on a side opposite to the non-magnetic layer for strongly fixing the magnetization of the pinned layer.

12. The magnetoresistance effect element according to claim 1, wherein the non-magnetic layer is magnesium oxide.

13. The magnetoresistance effect element according to claim 1, wherein:
the ferromagnet of at least one of the pinned layer and the magnetic recording layer is a ferromagnetic material including at least one type of a 3d transition metal; and
the magnetoresistance ratio is not less than 70%.

14. The magnetoresistance effect element according to claim 13, wherein the 3d transition metal is at least one of Co and Fe.

15. The magnetoresistance effect element according to claim 1, wherein the ferromagnet of at least one of the pinned layer and the magnetic recording layer is a ferromagnetic material with a damping constant of less than 0.1.

16. The magnetoresistance effect element according to claim 15, wherein the ferromagnetic material with the small damping constant is a Heusler alloy.

17. The magnetoresistance effect element according to claim 1, wherein the magnetoresistance ratio is controlled to be not less than 70%.

18. A magnetic memory comprising:
a plurality of bit lines disposed in parallel to each other;
a plurality of first source lines disposed in parallel to the bit lines and to each other;
a plurality of second source lines dispose in parallel to the bit lines and to each other;
a plurality of first word lines disposed in a direction intersecting the bit lines and in parallel to each other;
a plurality of second word lines disposed in a direction intersecting the bit lines and in parallel to each other;
a first selection transistor disposed at an intersection of the first source lines and the first word lines;
a second selection transistor disposed at an intersection of the second source lines and the second word lines; and
a magnetoresistance effect element disposed between the first selection transistor and the second selection transistor,
wherein:
the magnetoresistance effect element includes a pinned layer of a ferromagnet with a fixed magnetization direction; a magnetic recording layer of a ferromagnet with a thin wire shape including a region with a variable magnetization direction; and a non-magnetic layer with a thin wire shape formed between the pinned layer and the magnetic recording layer;
the magnetic recording layer includes three regions consisting of pinned magnetization regions at the ends and a magnetization switching region sandwiched therebetween, the pinned magnetization regions including current supply terminals;
at least one of the pinned layer and the magnetic recording layer is formed from a ferromagnet enabling a magnetization direction to be changed from parallel to perpendicular to a film plane by a film thickness control, with a magnetoresistance ratio controlled by the film thickness control and with the magnetization direction perpendicularly oriented with respect to the film plane;
the bit lines are electrically connected to the pinned layer of the magnetoresistance effect element;
one of the current supply terminals of the magnetoresistance effect element is electrically connected to a drain electrode of the first selection transistor;
another of the current supply terminals of the magnetoresistance effect element is electrically connected to a drain electrode of the second selection transistor;
the first source lines are electrically connected to a source electrode of the first selection transistor;
the second source lines are electrically connected to a source electrode of the second selection transistor;
the first word lines are electrically connected to a gate electrode of the first selection transistor; and
the second word lines are electrically connected to a gate electrode of the second selection transistor,
the magnetic memory further comprising a mechanism configured to apply a voltage to the bit lines, the first source lines, the second source lines, the first word lines, and the second word lines.

19. The magnetic memory according to claim 18, wherein the non-magnetic layer adjoins the three regions of the magnetic recording layer.

* * * * *